(12) United States Patent
Yuang (10) Patent No.: US 6,335,215 B1
(45) Date of Patent: Jan. 1, 2002

(54) SELF-ALIGNMENT METHOD OF MAKING

(75) Inventor: Rong-Heng Yuang, Hsinchu Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/556,894

(22) Filed: Apr. 20, 2000

(30) Foreign Application Priority Data

Feb. 17, 2000 (TW) .................................... 89102796 A (51) Int. Cl.$^7$ .............................................. H01L 21/00
(52) U.S. Cl. ............................ 438/31; 438/22; 438/42; 438/46; 438/47
(58) Field of Search ............................ 438/22, 31, 42, 438/46, 47

(56) References Cited

U.S. PATENT DOCUMENTS

| 4,728,628 A | * | 3/1988 | Fiddyment et al. |
| 4,830,980 A | * | 5/1989 | Hsieh |
| 5,208,183 A | * | 5/1993 | Chen et al. |
| 5,474,954 A | * | 12/1995 | Yang |
| 5,504,768 A | * | 4/1996 | Park et al. |
| 5,658,823 A | * | 8/1997 | Yang ........................... 438/38 |

\* cited by examiner

*Primary Examiner*—Long Pham
(74) *Attorney, Agent, or Firm*—W. Wayne Liauh (57) ABSTRACT

This specification discloses a structure of a ridge waveguide semiconductor laser and a self-alignment method of making the same. The structure comprises a ridge whose top surface is exposed to have direct contact with a metal electrode layer so as to lower the ohmic contact resistance. Two side walls of the ridge and two channels are covered by a dielectric layer with high thermal conductivity, and the peripheral platform surfaces are covered by another dielectric layer with low capacitance. Therefore, the obtained laser diode has features such as high heat dissipation and low capacity. In the manufacturing process, the ridge can have good ohmic contact with metal electrodes without the need of aligned contact holes. The end-point detector is used in the key step to perform precision control. A reactive ion etching (RIE) machine can be employed in the processes to perform large area homogeneous etching so that the laser devices require a lower manufacturing cost but obtain a higher yield. Also, the manufacturing process becomes more efficient.

13 Claims, 7 Drawing Sheets

SELF-ALIGNMENT METHOD OF MAKING

BACKGROUND OF THE INVENTION

1. Field of Invention

The present invention relates to a manufacturing method of making semiconductor lasers and, more particularly, to a structure of ridge waveguide semiconductor lasers and a self-alignment method of making the same.

2. Related Art

Figure 1:
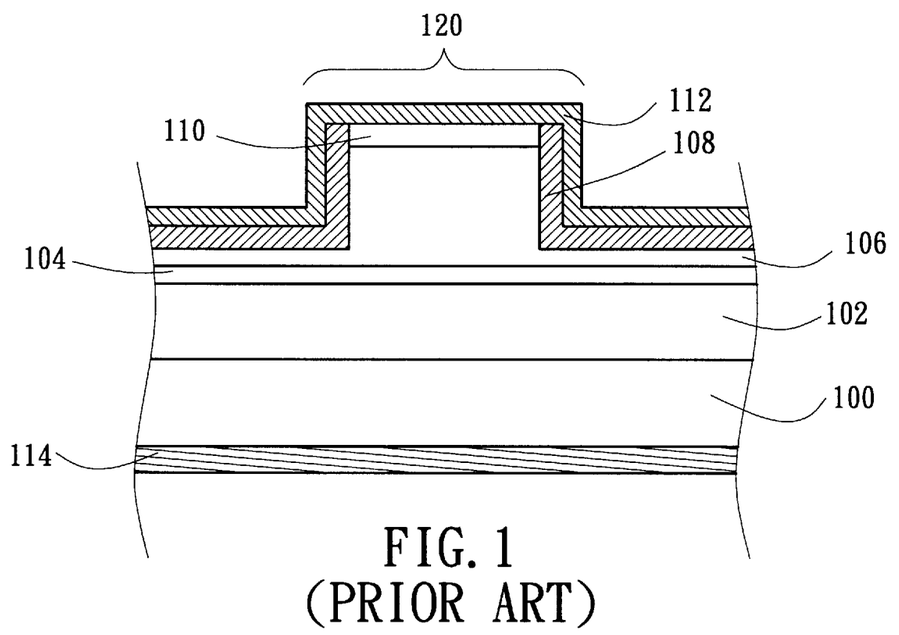
FIG. 1 is a cross-sectional view of a ridge waveguide laser diode in the prior art.

The structure of a common ridge-waveguide laser diode is shown in FIG. 1A. The laser diode includes a substrate 100, such as an N-type, and a first cladding and guiding layer 102, an active layer 104, a second cladding and guiding layer 106, a dielectric layer 108, and a cap layer 110, formed sequentially on the substrate 100. There are also a metal layer 112, a P-type metal electrode, located on the cap layer 110, and another metal layer 114, a N-type metal electrode, located underneath the substrate 100. The waveguide structure of the laser consists of the active layer 104, the first cladding and guiding layer 102, and the second cladding and guiding layer 106. Because the refraction index of the active layer 104 is larger than that of these two cladding and guiding layers 102 and 106, the light generated by the recombination of the carriers is then confined within the active layer 104.

Nowadays, double heterostructure (DH) is widely used in laser diodes. When the P-type electrode 112 is connected to a positive voltage and the N-type electrode is connected to a negative voltage, a consequent bias is generated. The resulting bias forces electrons from the N-type electrode, and the holes from the P-type electrode to flow toward the active layer 104. The potential barrier generated in the active layer 104 resists the passing of those electrons and holes. As a result, the over-populated electrons and holes within the active layer 104 cause population inversion. The recombination of carriers releases light of the same energy and phase, also known as a laser, which is an acronym for light amplification by stimulated emission radiation. In the foregoing ridge-waveguide laser, current can only flow through the surface of the ridge. The dielectric layer located on the sides of the ridge structure guides the light wave efficiently to improve the electro-optic effect.

Figure 2:
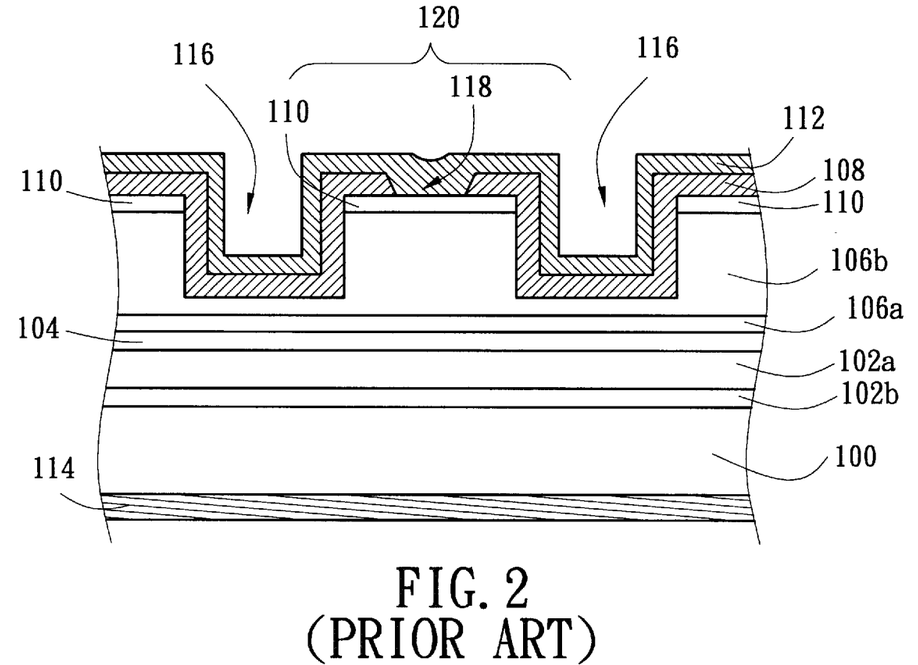
FIG. 2 is a cross-sectional view of a ridge waveguide laser diode with a double channel structure in the prior art.

Referring to FIG. 2, a ridge-waveguide laser of a double-channel structure 116 is shown. The first cladding and guiding layers 102 and 106 are further divided into cladding layers 102a and 106a, and guiding layers 102b and 106b. Then, as shown in FIG. 1B, an etching process is performed on the laser structure to form the double channel 116. A dielectric layer 108 is formed on the entire structure, and the dielectric layer 108 is patterned to form a contact opening that exposes the top of the cap layer 110. Then, a P-type metal electrode 112 is formed on the top of the substrate 100 and an N-type metal electrode 114 is formed underneath the substrate 100 to accomplish the structure of a ridge-waveguide laser diode.

Even though the foregoing method for forming a ridge-waveguide laser diode is simple, misalignment occurs in the step of forming the contact opening on the ridge structure 120, especially as the dimension of the ridge structure 120 is small. For Example, in a case having a contact opening of a 2 $\mu$m width on the ridge-structure of a 3 $\mu$m width, the alignment tolerance on either side is only 0.5 $\mu$m. This is too tiny for existent fabrication processes. Furthermore, because the ridge structure 120 is not entirely covered by the metal layer 112, the resistance of ohmic contact is larger and the thermal radiation is worse. That is, the conventional method for fabricating a ridge-waveguide laser diode cannot provide a convenient and reliable fabrication process, and a high-performance laser diode at the same time.

There are a number of methods to resolve the foregoing problems experienced in a ridge-waveguide laser, such as U.S. Pat. No. 4,728,628, U.S. Pat. No. 4,830,986, U.S. Pat. No. 5,059,552, U.S. Pat. No. 5,208,183, U.S. Pat. No. 5,474,954, U.S. Pat. No. 5,504,768, and U.S. Pat. No. 5,658,823.

As provided by the U.S. Pat. No. 5,504,768, a method includes forming a P-type metal layer, and using the P-type metal layer as a mask to form the ridge structure and the double channel, forming a dielectric layer on the substrate, and then, forming openings. Since the P-type metal layer covers the entire ridge structure, the problems of overheating and high resistance are resolved. However, the method has an alignment problem during the process of forming a narrow ridge structure.

There is another method described in U.S. Pat. No. 5,474,954 that applies a technique of self-alignment to from a current cutoff layer on the sidewall of the P-type metal for reducing the heat generated during lasing. As the integration of the laser diode is raised, an alignment problem still occurs in the fabrication process, and degrades the process yield.

In U.S. Pat. No. 4,728,628, a method that also uses a metal layer as a mask includes forming a dielectric layer after a ridge structure is formed, forming a P-type metal layer, and then, forming openings. The width of the opening is equal to the sum of the width of the double channel and the width of the ridge structure. A smaller opening whose width is equal to the width of the ridge structure is formed within the foregoing opening, and filled with metal. The method overcomes the alignment problem, but the absence of dielectric layer on either sidewall of the ridge structure causes problems including peeling of devices and a poor reliability under a high working temperature.

Likewise, in U.S. Pat. No. 5,208,183, a method is provided to fabricate a ridge waveguide laser diode having a very narrow ridge waveguide. Even though the provided method resolves the alignment problem by eliminating critical alignment steps from the fabrication process, other problems such as overheating still exist. In addition, Since current can only flow through a limited cross section, the resistance of ohmic contact on the laser diode is extravagant.

Besides, as described in U.S. Pat. No. 5,658,823, a method is provided to protect the dielectric on either sidewall of the ridge structure. The provided method includes removing only a portion of the photoresist located on the top of the ridge structure and in the mean time, still keeping the photoresist in the double channel. Referring to FIGS. 2 and 3, property curves are used to explain the relationship between he remaining thickness of different photoresist and the exposure time. As shown in FIG. 2, the curve 200 shows the relationship between the remaining thickness of a photoresist AZ1500 and the time exposed under the G-line mask aligner, whose wavelength is about 300 nm and up. The photoresist AZ1500 is entirely removed by just being exposed to the G-line for 10 seconds. In other words, for every two seconds the photoresist AZ1500 is exposed to the G-line, a thickness of a couple thousand angstroms is removed-line. So, it is obvious that the processing rate of the photolithography process that uses AZ1500 and the G-line is too fast to control.

In FIG. 3, the curve 300 shows the relationship between the remaining thickness of a photoresist ODUR1013 and the time exposed under the I-line, whose wavelength is less than 300 nm. About 100 seconds of exposure time are required to remove all the photoresist ODUR1013 and the rate of about 1000–2000 Å per 10 seconds. Even though -linethe removal rate is slower, it is still difficult to control the photolithography process. Therefore, exposing the dielectric on the top of the ridge structure by removing the photoresist thereon is not a very practical method for the task of fabricating a ridge-waveguide semiconductor laser.

According to the foregoing, misalignment always exists in a conventional method for fabricating a ridge-waveguide semiconductor laser. A ridge-waveguide semiconductor laser made by the conventional method has undesirable properties, a large resistance, and overheating problem. Furthermore, the conventional method, such as the one provided by U.S. Pat. No. 4,728,628, also causes short circuit problems.

Moreover, because the thickness of the photoresist and the exposure time are very difficult to control precisely, the dielectric located on the sidewalls of the ridge structure is easily removed. As a result, a metal layer formed by the follow-up process may not only cover the top of the ridge structure as designed, it may also cover the bottom of the double channel as well. The presence of unexpected materials on the bottom of the double channel degrades the current flowing into the device.

SUMMARY OF THE INVENTION

It is an object of the present invention to provide a self-alignment method for making ridge waveguide semiconductor lasers, which can form a ridge structure with good ohmic contact without the need of self-aligned holes.

The method disclosed in the present invention involves relatively simple manufacturing processes and each process can be precisely controlled such that control errors due to changed environments and materials used can be avoided. More particularly, the reactive ion etching (RIE) machine can be employed in the processes to perform large area homogeneous etching. With the function of the end-point detector, the manufacture of the laser device becomes more efficient. The method of the present invention can not only make highly efficient laser devices but also result in a higher yield while at a lower cost.

According to the above objects, the self-alignment method of making ridge waveguide semiconductor lasers of the present invention comprises the steps of: (a) providing an epitaxial chip with a layer structure including a first cladding wave guide layer, an active layer, a second cladding wave guide layer and a top cover layer sequentially formed on a substrate; (b) forming a first dielectric layer with low capacitance on the top cover layer of the epitaxial chip; (c) forming a first patterned dielectric layer to define a channel mask; (d) etching the epitaxial chip to form a structure with a ridge and double channels in adjacency; (e) partially removing the first dielectric layer on the ridge; (f) forming a second dielectric layer with high thermal conductivity on the ridge, the double channels and the unremoved first dielectric layer; (g) depositing a photoresist layer on the second dielectric layer; (h) etching the photoresist layer to completely remove the photoresist layer on the ridge top surface; (i) etching the second dielectric layer to completely remove the second dielectric layer on the ridge top surface; j) forming a first metal layer covering the ridge top surface as an electrode; and (k) forming a second metal layer on the substrate surface as an electrode.

Moreover, steps (h) and (i) further comprise the step of shining a laser beam on places over the platform except the ridge and the double channels. When it is detected that the laser beam is shining on a different layer, the etching process is stopped to perform in-situ check on whether the photoresist layer or the second dielectric layer on the ridge top surface is completely etched away. This utilizes the manufacturing process control with end-point detection. Due to this precise control, the etching process can be implemented by homogeneous and large-area reactive ion etching so that the first dielectric layer with low capacitance only forms on contact pad surfaces of the laser devices. Since the positions of the contact pads are the ones for subsequent laser device wire connections, laser devices with smaller capacity can be obtained with thicker first dielectric layers of lower capacitance formed thereon. At the same time, the second dielectric layer with high thermal conductivity only forms on the surfaces of both ridge sides and the double channels. Since photons are emitted from the ridge, it must have a good ability in heat dissipation. The laser devices thus obtained have lower capacity and higher thermal conductivity.

It is another object of the present invention to provide a ridge waveguide semiconductor laser, which has such device characteristics as low capacity and high heat dissipation ability.

These and additional objects and advantages, as well as other embodiments of the invention, will be more readily understood after a consideration of the drawings and the detailed description of the preferred embodiments.

BRIEF DESCRIPTION OF THE DRAWINGS

For a more complete understanding of the present invention, reference is made to the following Detailed Description Taken in conjunction with the accompanying drawings in which.

DETAILED DESCRIPTION OF THE INVENTION

Figure 3A:
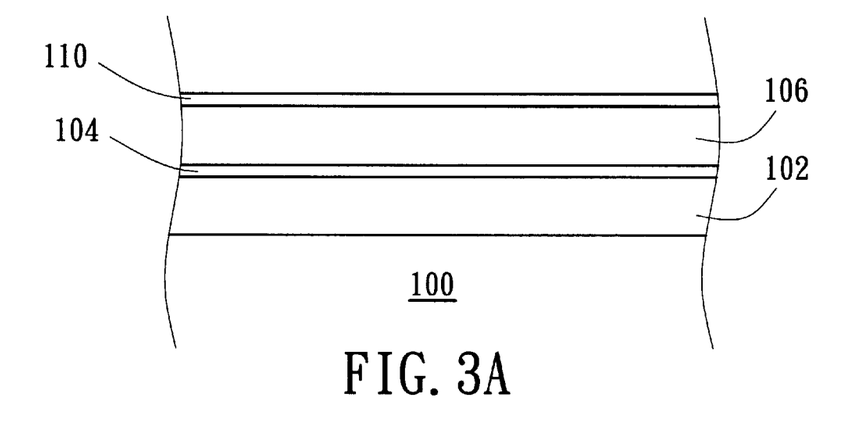
FIGS. 3A through 3P are cross-sectional views showing the steps of manufacturing a ridge waveguide semiconductor laser using the self-alignment method of the present invention.
Figure 3B:
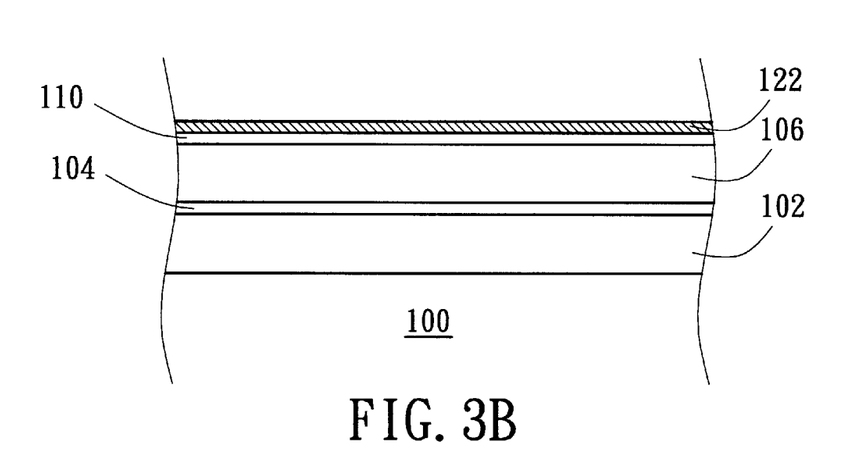
Figure 3C:
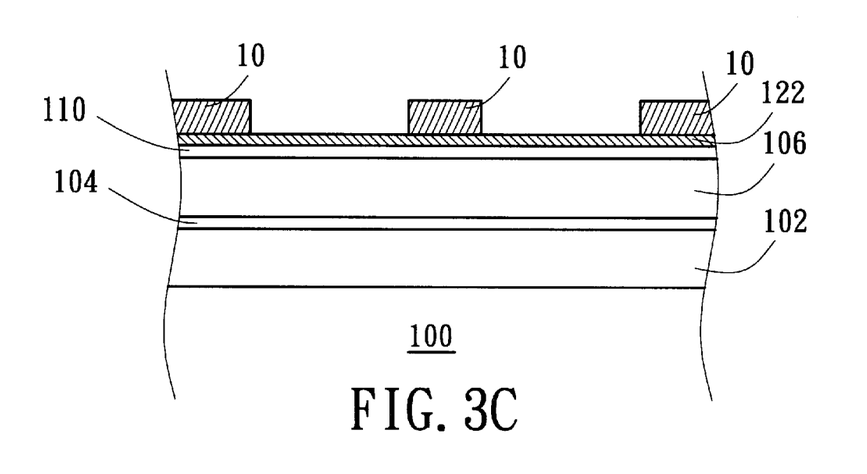
Figure 3D:
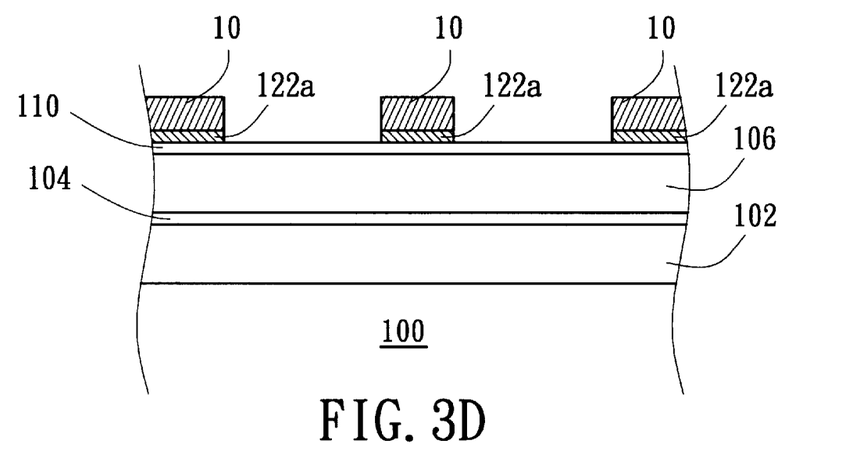
Figure 3E:
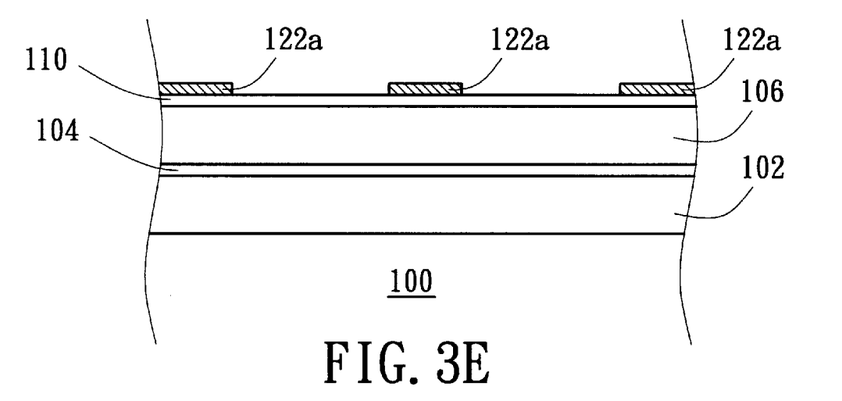
Figure 3F:
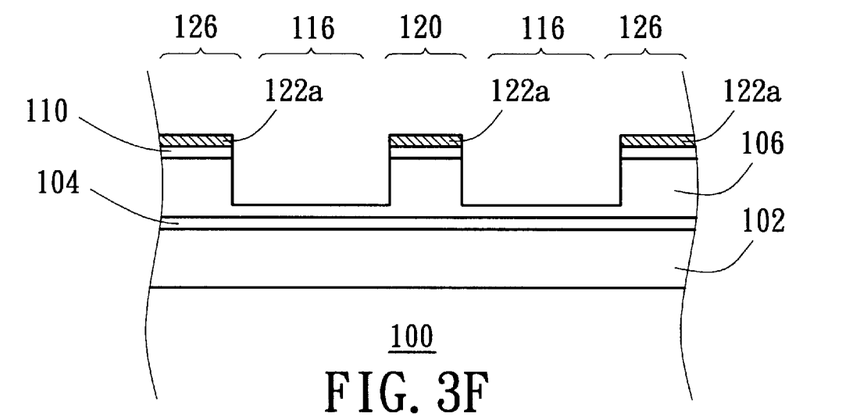
Figure 3G:
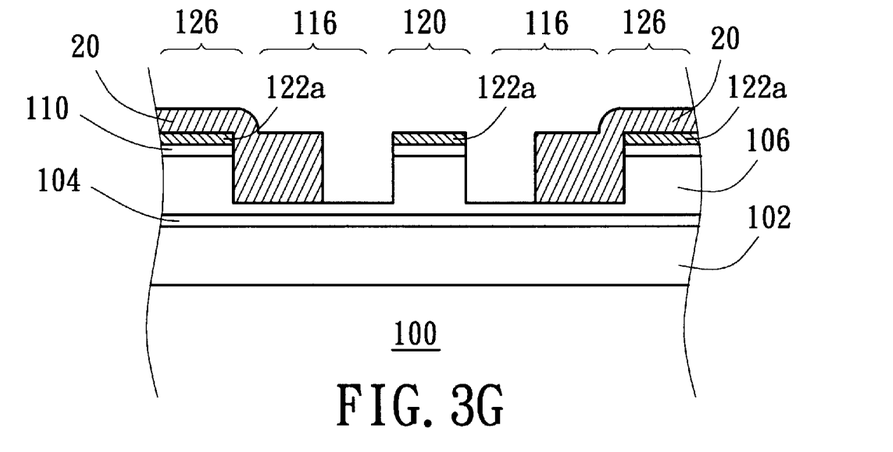
Figure 3H:
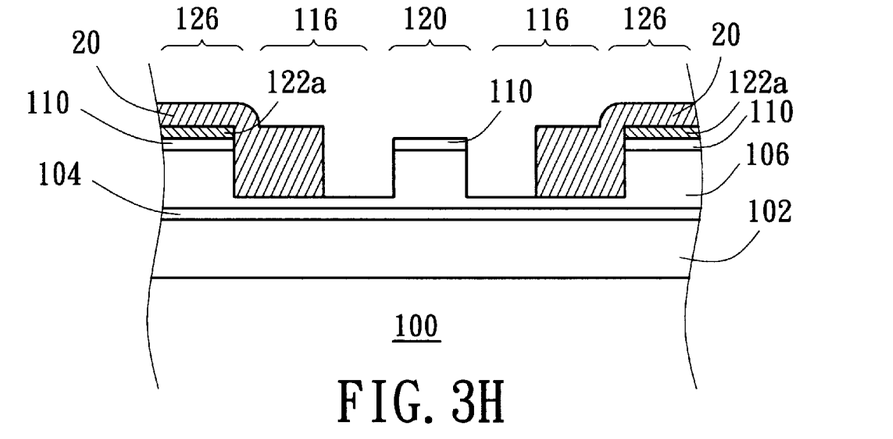
Figure 3I:
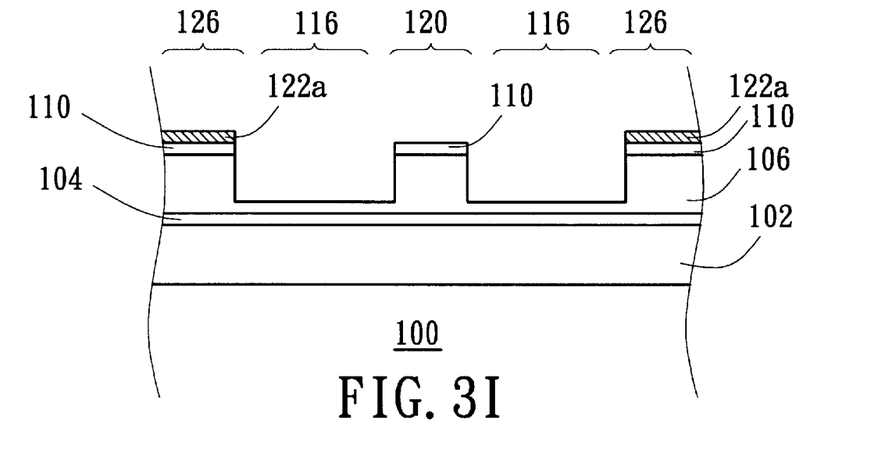
Figure 3J:
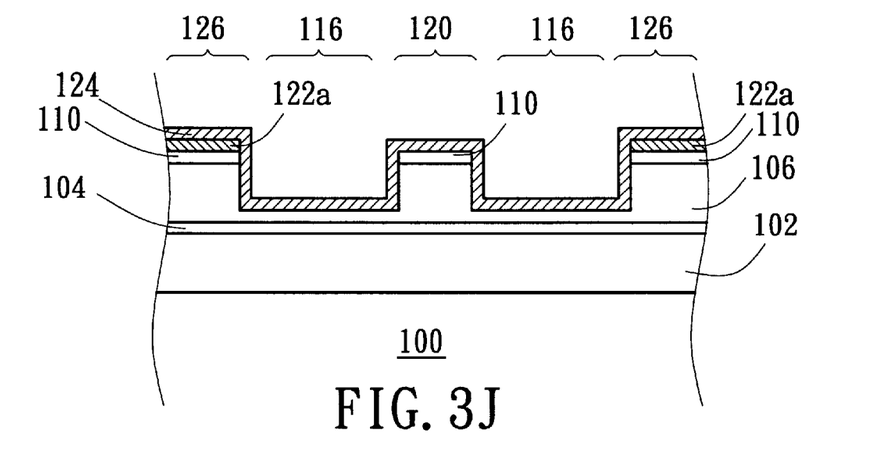
Figure 3K:
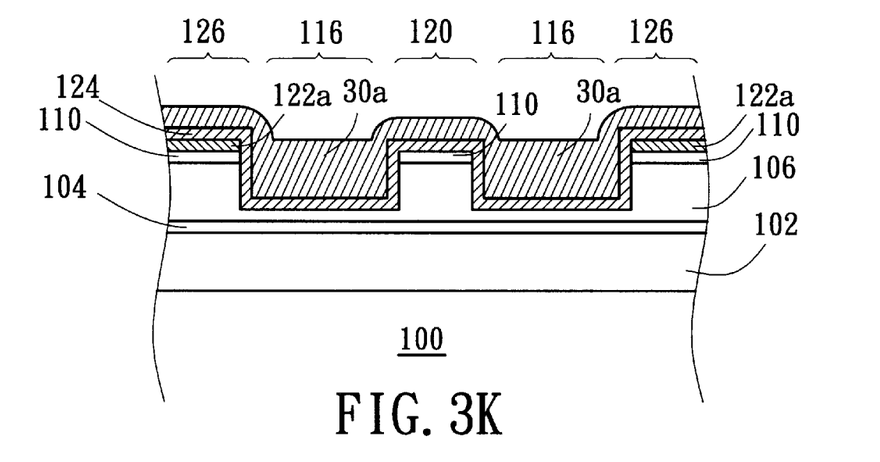
Figure 3L:
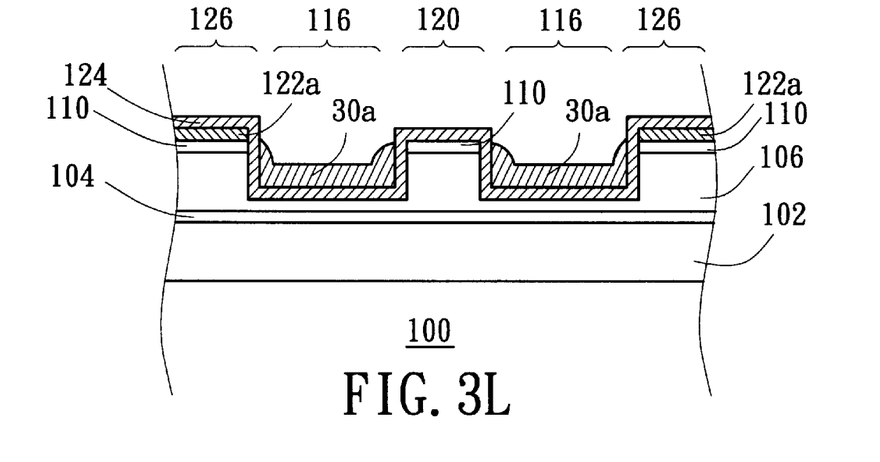
Figure 3M:
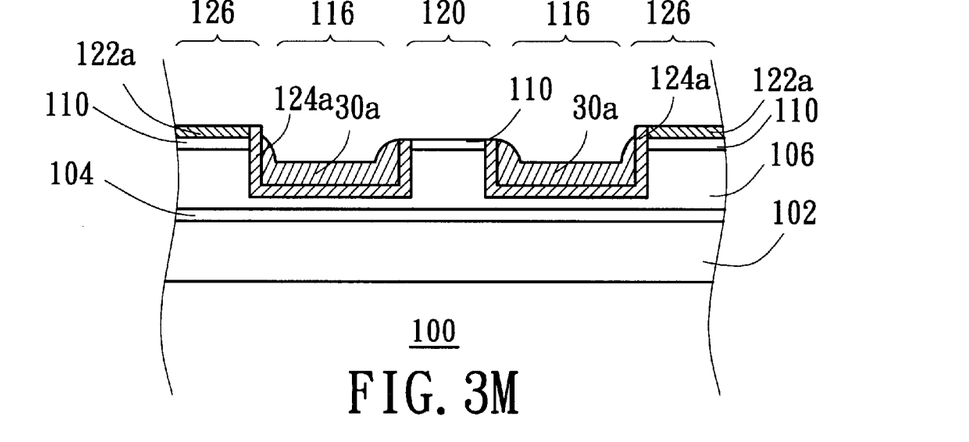
Figure 3N:
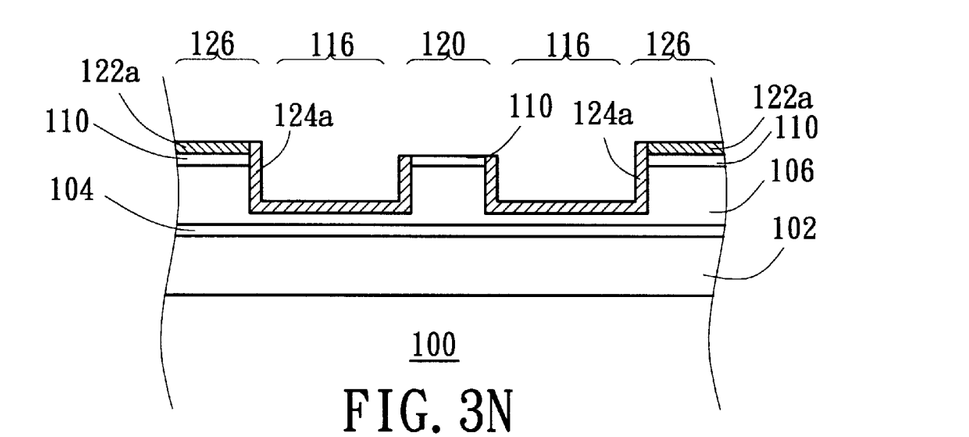
Figure 3O:
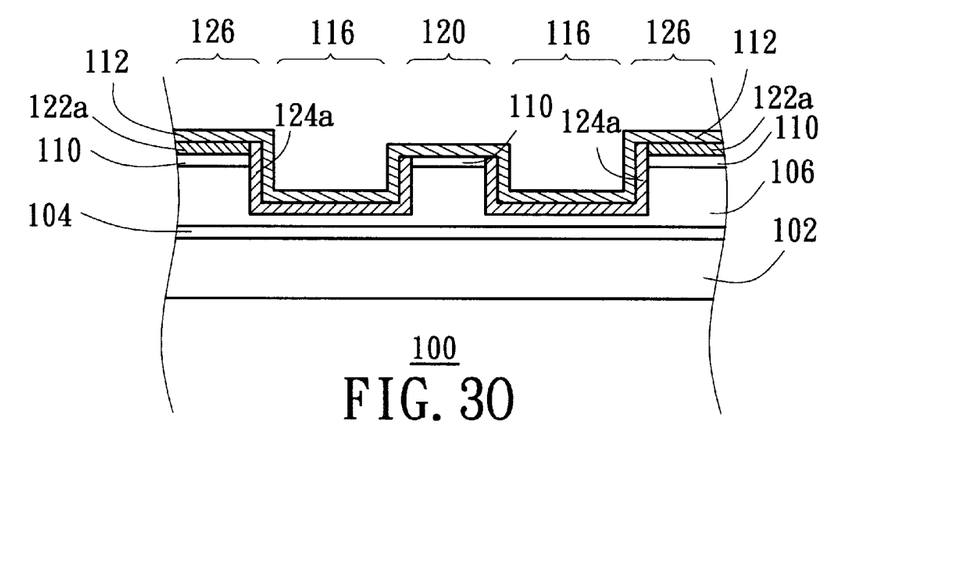
Figure 3P:
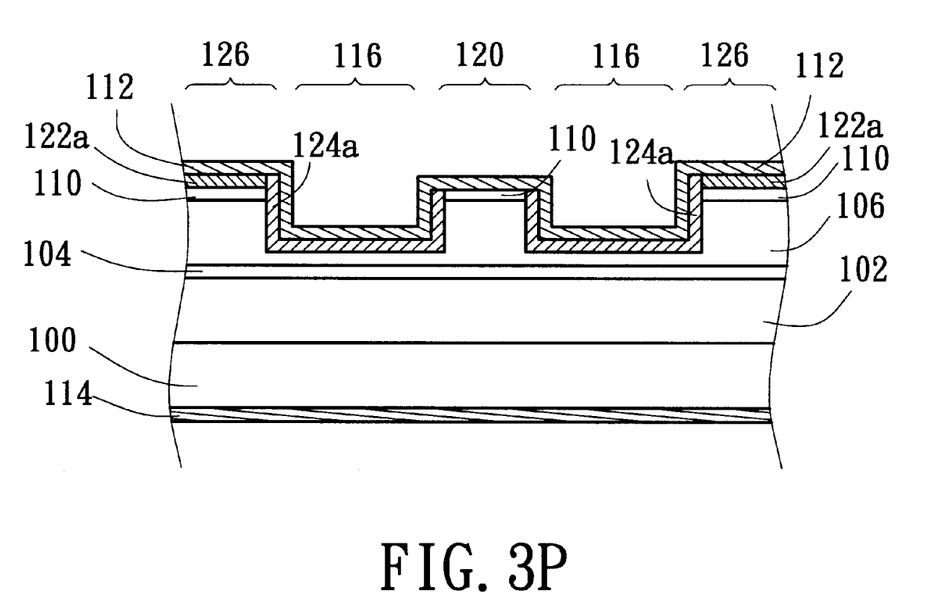

FIGS. 3A through 3P provide a preferred embodiment of the manufacturing method for manufacturing a ridge waveguide semiconductor laser according to the present invention.

Referring to FIG. 3A, a substrate 100 (such as an N-type InP substrate) is sequentially stacked with an N-type first cladding waveguide layer 102, an active layer 104, a P-type second cladding waveguide layer 106, and a top cover layer 108, such as a P-type impurity doped semiconductor layer, to form an epitaxial chip with a layer structure. The epitaxial chip is preprocessed by dipping in solutions such as trichloroethane (TCE), acetone (ACE), IPA, and buffered oxide etchant (BOE) to complete chip cleaning and preliminary oxide removal.

As shown in FIG. 3B, a first dielectric layer 122, such as silicon oxide ($SiO_x$) is deposited on the top cover layer 108 of the epitaxial chip using plasma enhanced chemical vapor deposition (PECVD). It is required that this dielectric layer 122 must have low capacitance. This layer is preferable to have a thickness ranging from 1000Å to 4000Å, but is not limited to this range. In the current embodiment, the thickness is 2500Å.

Referring to FIG. 3C, a photoresist 10 pattern is obtained after such photolithography processes as depositing a photoresist layer, exposure, and development. The photoresist 10 is then used as a mask when etching the exposed first dielectric layer 122. As shown in FIG. 3D, the first dielectric layer 122 is etched using reactive ion etching (RIE) with $SF_6$ as the etchant gas, and the remaining first dielectric layer 122a only covers a portion of the top cover layer 108. The photoresist 10 is removed by immersing in an ACE solution. The first dielectric layer 122a thus formed functions as a channel mask, as in FIG. 3E.

In FIG. 3F, the epitaxial chip is etched using the first dielectric layer 122a as a mask. Thus, the other portion of the top cover layer 108 is removed and the second cladding waveguide layer 106 is etched away to a certain depth. Similarly, RIE can be employed but with methane/helium ($CH_4/H_2$) as the etchant gas, and the structure of a ridge 120, two channels 116 (double channels), and a contact pad platform 126 for subsequent laser device wire connections is formed.

With respect to FIG. 3G, another photoresist 20 pattern is obtained after such photolithography processes as depositing a photoresist layer, exposure, and development. This step is to remove the first dielectric layer 122a on the top surface of the ridge 120, so the photoresist 20 has to cover the platform 126 area. The epitaxial chip is immersed in a BOE solution to obtain a result as shown in FIG. 3H. FIG. 3I shows that the chip is further immersed in an ACE solution to remove the photoresist 20.

Please refer to FIG. 3J. Another second dielectric layer 124, which can be a silicon nitride ($SiN_x$) layer or other high thermal conductivity materials such as an amorphous silicon or SiC semiconductor layer, is deposited on the whole epitaxial chip. The area covered includes the first dielectric layer 122a covering the platform 126 area and its side wall surfaces, the double channels 116, and both sides and the top cover layer 108 of the ridge 120. This can be similarly formed using PECVD and the second dielectric layer 124 has such characteristics as high thermal conductivity. The second dielectric layer is preferable to have a thickness ranging from 1000 Å A to 2000 Å, but is not limited to this range. In the current embodiment, the thickness is 1000Å.

As shown in FIG. 3K, a photoresist 30 is formed on the epitaxial chip by spin coating, covering the surface of the second dielectric layer 124. Due to the employed spin coating, the photoresist layer 30 is thicker within the double channels 116 than other places. The photoresist layer 30 is etched back, as shown in FIG. 3L, in such a manner that part of the photoresist layer 30 is removed with the remaining photoresist layer 30a protecting the second dielectric layer 124 on both sides of the ridge 120 and the double channels 116 from being etched away in subsequent processes. A beam of laser is shining on the platform 126 while etching to achieve the function of end-point detection. Since the width of the ridge 120 is small, e.g. 2 μm, the laser beam can not directly shine on it to detect whether the photoresist on the ridge top surface has been etched away completely or not. Yet the same object can be achieved by directing the laser beam on the platform 126 because the photoresist layer 30 is formed by coating and the thickness of photoresist on both the ridge 120 and the platform 126 is about the same. Therefore, when etching is undergoing continuously, one can learn whether the photoresist layer on the ridge 120 has been completely removed by knowing whether the photoresist layer on the platform 126 has been completely removed according to the reflected laser beam. This realizes the in-situ process monitoring and control by shining a laser beam on the platform 126. A precise control in the etching process of the photoresist layer 30 is possible because RIE has the ability to perform homogeneous and large area etching. Of course, one can choose not to follow the above precise monitoring and to control the manufacturing process by registering the etching time as in the prior art.

Referring to FIG. 3M, the remaining photoresist layer 30a roughly covers the side wall surfaces of the platform 126, the double channels 116 and both sides of the ridge 120. A portion of the second dielectric layer 124 is then removed. Likewise, a beam of laser light shines on the platform 126. Whether the second dielectric layer 124 on the platform 126 is completely removed is determined from the reflected laser beam. When the end-point detector detects that the laser shines on the first dielectric layer 122a of silicon oxide, the second dielectric layer 124 of silicon nitride on the ridge top surface 120 is completely removed. Accordingly, this etching process can also be precisely controlled using RIE with $SF_6$ as the etchant gas. Since the etching speed of the $SF_6$ gas on silicon nitride is much faster than on silicon nitride, it is easier to obtain the result shown in the drawing. Similarly, conventional etching time registry can be used to control the manufacturing process.

Referring to FIG. 3N, the photoresist layer 30a is removed by immersing in an ACE solution. As in the prior art, a P-type metal layer 110 is deposited on the whole epitaxial chip, covering the first dielectric layer 122a over the platform 126 area and the second dielectric layer 124a on its side wall surfaces, the second dielectric layer 124a on the double channels 116, and the second dielectric layer 124a on both sides of the ridge 120 and its top cover layer surface 108, as shown in FIG. 3O. Furthermore, by thinning the substrate 100, an N-type metal layer 112 is deposited on the surface of the substrate 100 at the bottom of the epitaxial chip. This completes the manufacture of a ridge waveguide semiconductor laser diode. In particular, the P-type metal layer 110 can be a Ti/Pt/Au electrode layer formed by evaporation with a thickness of 100 Å/2000 Å/2000 Å. Likewise, the N-type metal layer 112 can be an AuGe/Ni/Au electrode layer formed by evaporation with a thickness of 500 Å/200 Å/3000 Å in the preferred embodiment.

To summarize, steps in FIGS. 3G through 3M describe how the present invention achieves good ohmic contact in the ridge structure. In steps shown in FIGS. 3K and 3L, part of the photoresist layer is etched away with the remaining photoresist layer protecting the second dielectric layer on both side walls of the ridge and the double channels from being etched away in subsequent processes. In steps shown in FIGS. 3L and 3M, the second dielectric layer on the ridge top is further etched away. Both steps utilize a laser beam shining on the platform area other than the ridge and the double channels so as to have in-situ check on whether the photoresist layer or the second dielectric layer on the ridge top is completely etched away. This realizes the manufacture control with the function of end-point detection. It is this precise control that makes fast and large area etching such as RIE possible. The etching is stopped when the laser is detected to shine on a different layer through the reflected laser beam. For example, if the laser originally shines on the photoresist layer, then the photoresist layer etching process would be ceased when it is detected that the laser shines on the second dielectric layer. Furthermore, the first dielectric layer with low capacitance only forms on contact pad surfaces of laser devices. Since the positions of the contact pads are the ones for subsequent laser device wire connections, laser devices with smaller capacity can be obtained with thicker first dielectric layers of lower capacitance formed thereon. At the same time, the second dielectric layer with high thermal conductivity only forms on the surfaces of both ridge sides and the double channels. Since photons are emitted from the ridge, it must have a good ability in heat dissipation. Therefore, the laser devices obtained according to the above method of the present invention have lower capacity and higher thermal conductivity.

In summary, the self-alignment method of manufacturing ridge waveguide laser diodes according to the present invention involves simpler processes. The key step is to use RIE technology and the function of end-point detection to precisely perform manufacturing process control and make large area devices. The laser thus obtained possesses superior device characteristics. The present invention provides devices with a higher yield and better characteristics at a lower chip manufacturing cost. In addition, this new manufacturing method can be applied to ridge waveguide laser devices at other wavelengths, such as the red light and blue light laser devices. Thus, the products have a great market potential.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A self-aligned method of making a ridge-waveguide semiconductor laser, comprising the steps of:
    (a) providing an epitaxial chip with a layered structure including an active layer formed on a substrate;
    (b) forming a first dielectric layer with low capacitance on top of the epitaxial chip;
    (c) forming a first patterned dielectric layer to define a channel mask;
    (d) etching the epitaxial chip to form a structure with a ridge and two channels in adjacency;
    (e) partially removing the first dielectric layer on the ridge;
    (f) forming a second dielectric layer with high thermal conductivity on the ridge, the channels and the remaining first dielectric layer;
    (g) depositing a photoresist layer on the second dielectric layer;
    (h) etching the photoresist layer to completely remove the photoresist layer on a top surface of the ridge;
    (i) etching the second dielectric layer to completely remove the second dielectric layer on the ridge top surface;
    (j) forming a first metal layer covering the ridge top surface as an electrode; and
    (k) forming a second metal layer on a surface of the substrate as an electrode;
    wherein step (h) further comprises the steps of:
        shining a laser beam on places over the photoresist layer other than the ridge and the two channels;
        etching the photoresist layer using reactive ion etching; and
        stopping the photoresist layer etching once the laser is detected to shine on the second dielectric layer.

2. The self-alignment method of claim 1, wherein the layer structure of the epitaxial chip comprises a first cladding waveguide layer, the active layer, a second cladding waveguide layer and a top cover layer sequentially formed on the substrate.

3. The self-alignment method of claim 1, wherein the first dielectric layer is made of silicon oxide.

4. The self-alignment method of claim 1, wherein the second dielectric layer is made of silicon nitride.

5. The self-alignment method of claim 1, wherein step (h) further comprises the steps of:
    shining a laser beam on places over the photoresist layer other than the ridge and the two channels;
    etching the photoresist layer using reactive ion etching; and
    stopping the photoresist layer etching once the laser is detected to shine on the second dielectric layer.

6. The self-aligned method of claim 1, wherein the reactive etching uses oxygen as the etchant gas.

7. A self-aligned method of making a rigde-waveguide semiconductor laser, comprising the steps:
    (a) providing an epitaxial chip with a layered structure including an active layer formed on a substrate;
    (b) forming a first dielectric layer with low capacitance on top of the epitaxial chip;
    (c) forming a first patterned dielectric layer to define a channel mask;
    (d) etching the epitaxial chip to form a structure with a ridge and two channels in adjacency;
    (e) partially removing the first dielectric layer on the ridge;
    (f) forming a second dielectric layer with high thermal conductivity on the ridge, the channels and the remaining first dielectric layer;
    (g) depositing a photoresist layer on the second dielectric layer;
    (h) etching the photoresist layer to completely remove the photoresist layer on a top surface of the ridge;
    (i) etching the second dielectric layer to completely remove the second dielectric layer on the ridge top surface;
    (j) forming a first metal layer covering the ridge top surface as an electrode; and
    (k) forming a second metal layer on a surface of the substrate as an electrode;
    wherein step (i) further comprises the steps of:
        shining a laser beam on places over the second dielectric layer other than the ridge and the two channels;
        etching the second dielectric layer using reactive ion etching; and
        stopping the second dielectric layer etching once the laser is detected to shine on the first dielectric layer.

8. The self-aligned method of claim 1, wherein the reactive etching uses $SF_6$ as the etchant gas.

9. The self-aligned method of claim 1, wherein the first metal layer is made of a P-type metal selected from the group consisting of Ti, Pt, and Au.

10. The self-aligned method of claim 1, wherein the second metal layer is made of an N-type metal selected from the group consisting of AuGe, Ni, and Au.

11. The self-aligned method of claim 7, wherein the reactive etching uses $SF_6$ as the etchant gas.

12. The self-aligned method of claim 7, wherein the first metal layer is made of a P-type metal selected from the group consisting of Ti, Pt, and Au.

13. The self-aligned method of claim 7, wherein the second metal layer is made of an N-type metal selected from the group consisting of AuGe, Ni, and Au.

* * * * *